(12) United States Patent
Iwata

(10) Patent No.: US 6,199,191 B1
(45) Date of Patent: Mar. 6, 2001

(54) VITERBI DECODING METHOD AND DEVICE THEREOF

(75) Inventor: Jun Iwata, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/095,761

(22) Filed: Jun. 11, 1998

(30) Foreign Application Priority Data

Jun. 11, 1997 (JP) .................................................... 9-153431

(51) Int. Cl.[7] .................................................. H03M 13/41
(52) U.S. Cl. ............................................ 714/795; 714/774
(58) Field of Search ................................ 7414/708, 774, 7414/775, 776, 788, 789, 795

(56) References Cited

U.S. PATENT DOCUMENTS 5,509,020 * 4/1996 Iwakiri et al. .......................... 371/43
5,537,445 * 7/1996 Blaker et al. ......................... 375/341

OTHER PUBLICATIONS

Kubota et al., "Compact, High–Speed and High–Coding–Gain General Purpose FEC Encoder/Decoder –NUFEC codec–", IEEE CH2655–9/89/0000–0798, pp. 798–803, Dec. 1989.*

Kong et al., "A Fast Serial Viterbi Decoder ASIC for CDMA Cellular Base Station", 1996 IEEE Tencon, pp. 333–337, Dec. 1996.*

* cited by examiner

*Primary Examiner*—Stephen M. Baker
(74) *Attorney, Agent, or Firm*—Venable; Robert J. Frank; Allen Wood

(57) ABSTRACT

A Viterbi decoding method for decoding a received signal, doing an ACS process and a trace back process a first number of times, and doing the ACS process a second number of times and the trace back process the first number of times until the trace back process is complete for all of the bits to be decoded if the tracing back has not already been finished for all bits, the Viterbi decoding method further including: after the trace back processing has finished for all of the bits to be decoded, deciding a fame error based on the result of calculating a Hamming distance between the received signal and re-encoded decoded signal, and possibly changing the first number and/or the second number depending on value stored in a counter which signifies the condition of the frame error for the past several times.

14 Claims, 7 Drawing Sheets

VITERBI DECODING METHOD AND DEVICE THEREOF

BACKGROUND OF THE INVENTION

1. Title of the Invention

The present invention generally relates to Viterbi decoding method and device thereof, more particularly, relates to path trace method in Viterbi decoding method.

This application is a counterpart of Japanese application Serial Number 09-153431 filed on Jun. 11, 1997, the subject matter of which is incorporated herein by reference.

2. Description of the Related Art

A convolution coding method is one of the error correcting codes which is used in the digital communication. A Viterbi decoding algorism is known as one of a maximum likelihood decoding method in order to decode information coded by convolution coding method.

The Viterbi decoding algorism compare the received bit line with the bit line provided by the trellis diagram, and decode received bit line according to selecting a path which has the least error. A standard value called as a metric, is compared to select the path. There are a branch metric and a path metric in the metric. The branch metric is calculated according to received bit line each states at each times, and the path metric is the cumulative total of the path metric at each time. There will always be two possible paths entering each state; one of two will be eliminated by comparing the path metrics. The process as above mentioned is known as ACS process (Added Compare-Select process). A path selecting signal is memorized in the path memory. The path selecting signal is information that which path is selected at each states.

After ACS process is done with regard to the received bit line having a predetermined decoding cycle, a state having the maximum likelihood path metric which is a path metric having a best possibility for the received bit line, is selected. This state is called as the maximum likelihood state. The received bit line can be decoded by tracing the path selecting signal memorized in the path memory as the start of the maximum likelihood state. This process in the Viterbi decoding algorism is called as a path trace method.

There are two method in the path trace method. One is called as a trace forward method which traces the memorized paths by FIFO method. The other is called a trace back method which trace the memorized paths by LIFO method. The present invention relates to the trace back method.

FIG. 1 discloses a Viterbi decoding algorism of the related art.

The necessary variable to carry out this algorism are initialized (step 101). The ACS process (step 102) and the trace back method (step 103) are done until the path memory length times (At1) initialized in step 101, respectively. In step 104, whether the trace back method is done for all of the decoding bit line should be decoded or not, is decided. If not, the ACS process is done until the path stop length times (At2) initialized in step 101, and the trace back method is done until the path memory length times (At1). Again, in step 104, whether the trace back method is done for all of the decoding bit line should be decoded or not, is decided. Steps 105 and 106 are done until the trace back method is done for all of the decoding bit line should be decoded. If the trace back method is done for all of the decoding bit line should be decoded, a frame error of the decoding bit line is decided (step 107). By the way, there is the folloing relationship between the path memory length (At1) and the path stop length (At2); At1≧At2.

FIG. 2 discribes a sample to understand the Viterbi decoding algorism of the related art. In FIG. 2, all of the decoding bit line is 192, the path memory length (At1) is 96 and the path stop length (At2) is 32. And an address of the path memory is a cyclic address, and memorizing the path selecting signal starts from the first address of the path memory.

The ACS process is done at At1=96 times (step 101), and the trace back method is done at At1=96 times (step 102). By this process, 32 bits initialized as the path stop length (At2) is determined as the decoding bits.

Because the trace back method for all of the decoding bit line should be decoded is not done (step 104), moreover, the ACS process is done at At2=32 times (step 105), and the trace back method is doneatAtl=96 times (step 106). And 32 bits is determined as the decoding bits. The path selecting signal is memorized from the address which is the first address of the path memory.

By repeating steps 105 and 106 at three times, the trace back method with regard to all of the decoding bit line should be decoded, is finished. Thereby, the bits which is determined at the last trace back method, is 96 bits. The frame error of the decoding bit line is decided (step 107).

SUMMARY OF THE INVENTION

An object of the present invention is to provide a trace back method which is able to change the path memory length and the path stop length which greatly affect a Frame Error Rate (thereinafter FER), based on the result of the frame error decision.

According to one aspect of the present invention, for achieving the above object, there is provided a Viterbi decoding method for decoding a received signal, doing an ACS process and a trace back process at a first value times, doing the ACS process at a second value times and the trace back process at the first value times until the trace back process is complete for all decode bits when the trace back has not finished for all decode bits, the Viterbi decoding method further comprising; after the trace back has finished for all decode bits, deciding a frame error based on the result of calculating a Hamming distance between the received signal and re-encoded decoded signal, changing the first value or the second value based on the result of the decision of the frame error and a value of the counter which signifies the condition of the frame error for the past several times.

According to another aspect of the present invention, for achieving the above object, there is provided a Viterbi decoding device for decoding an received signal, doing an ACS process and a trace back process at a first value times, doing the ACS process at a second value times and the trace back process at the first value times until the trace back process is complete for all decode bits when the trace back has not finished for all decode bits, the Viterbi decoding device further comprising; a frame error determination part for deciding a frame error based on the result of calculating a Hamming distance between the received signal and re-encoded decoded signal, a frame error condition counter for counting the frame error for the past frame, a controller for deciding whether the first value or the second value change or not based on the result of the frame error deermination part and the value of the frame error condition counter.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A first preferred embodiment

A trace back method in the Viterbi decoding algorism according to a first preferred embodiment of the present invention will hereinafter be described in detail with reference to FIG. 3, FIG. 4, FIG. 5 and FIG. 6.

Figure 1:
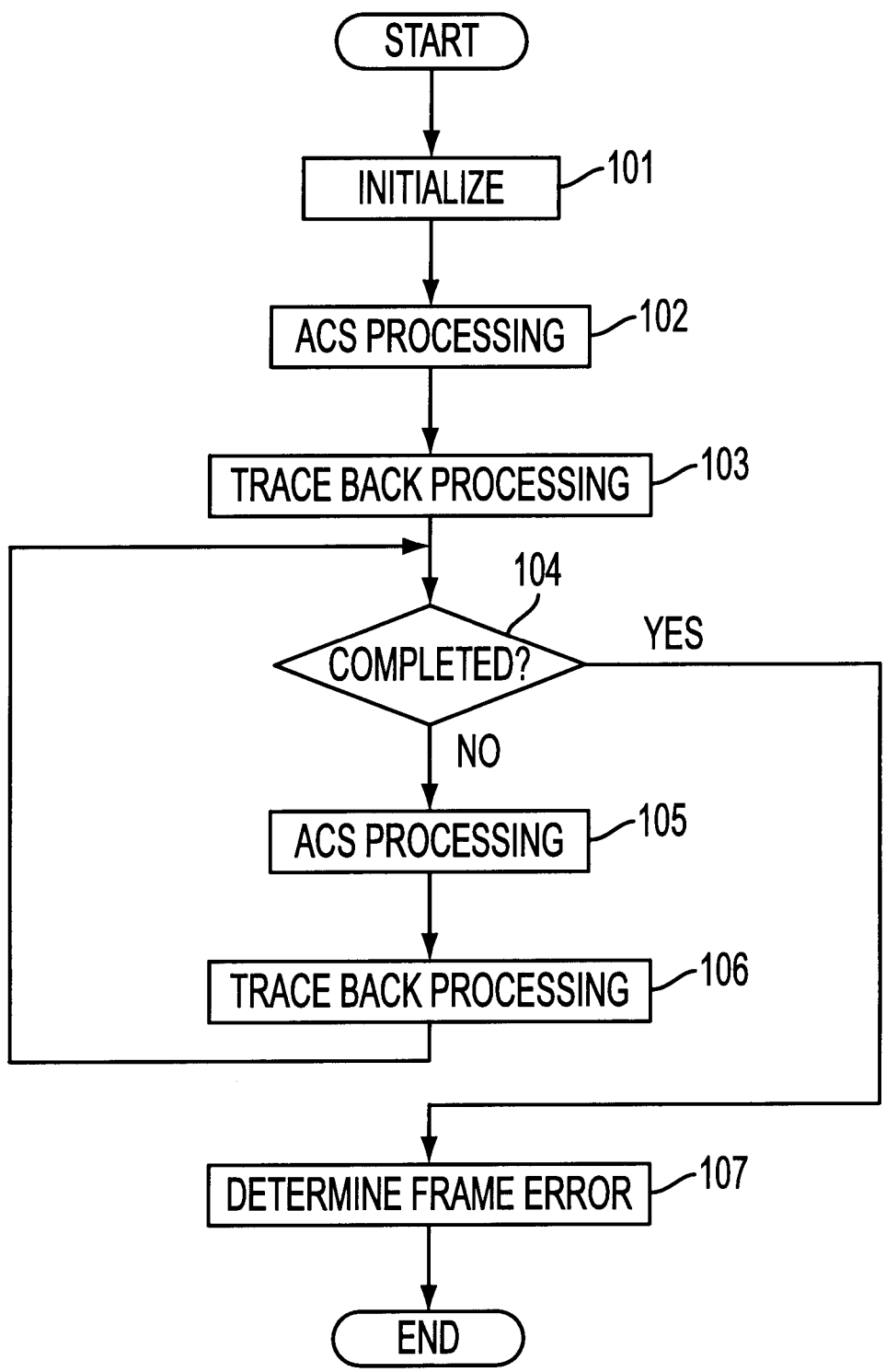
FIG. 1 is a flow chart explaining a trace back method of the related art.
Figure 2:
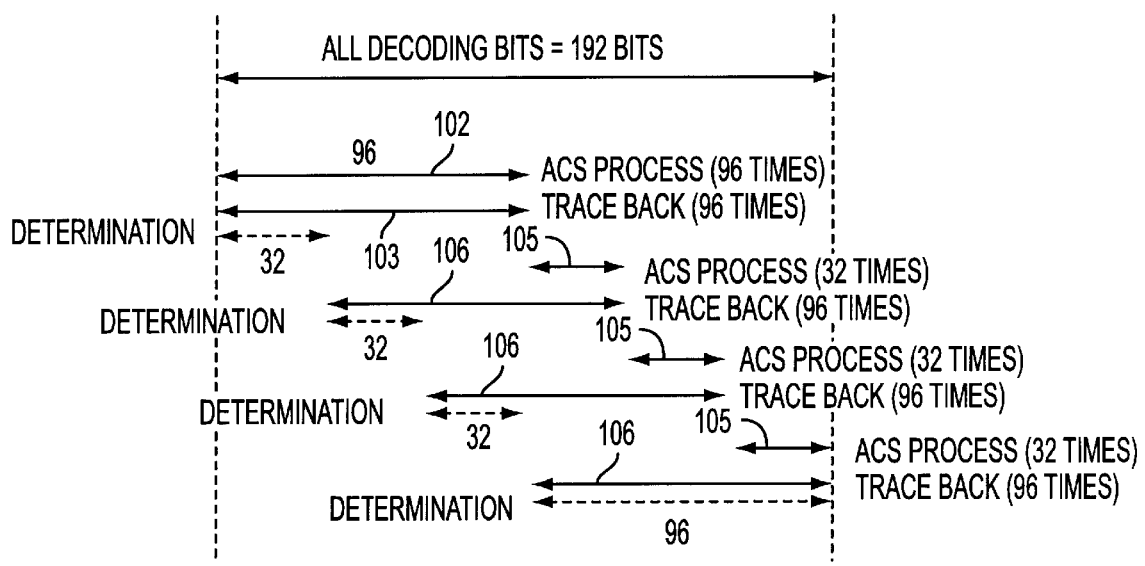
FIG. 2 is a sample to understand the Viterbi decoding algorism of the related art.
Figure 3:
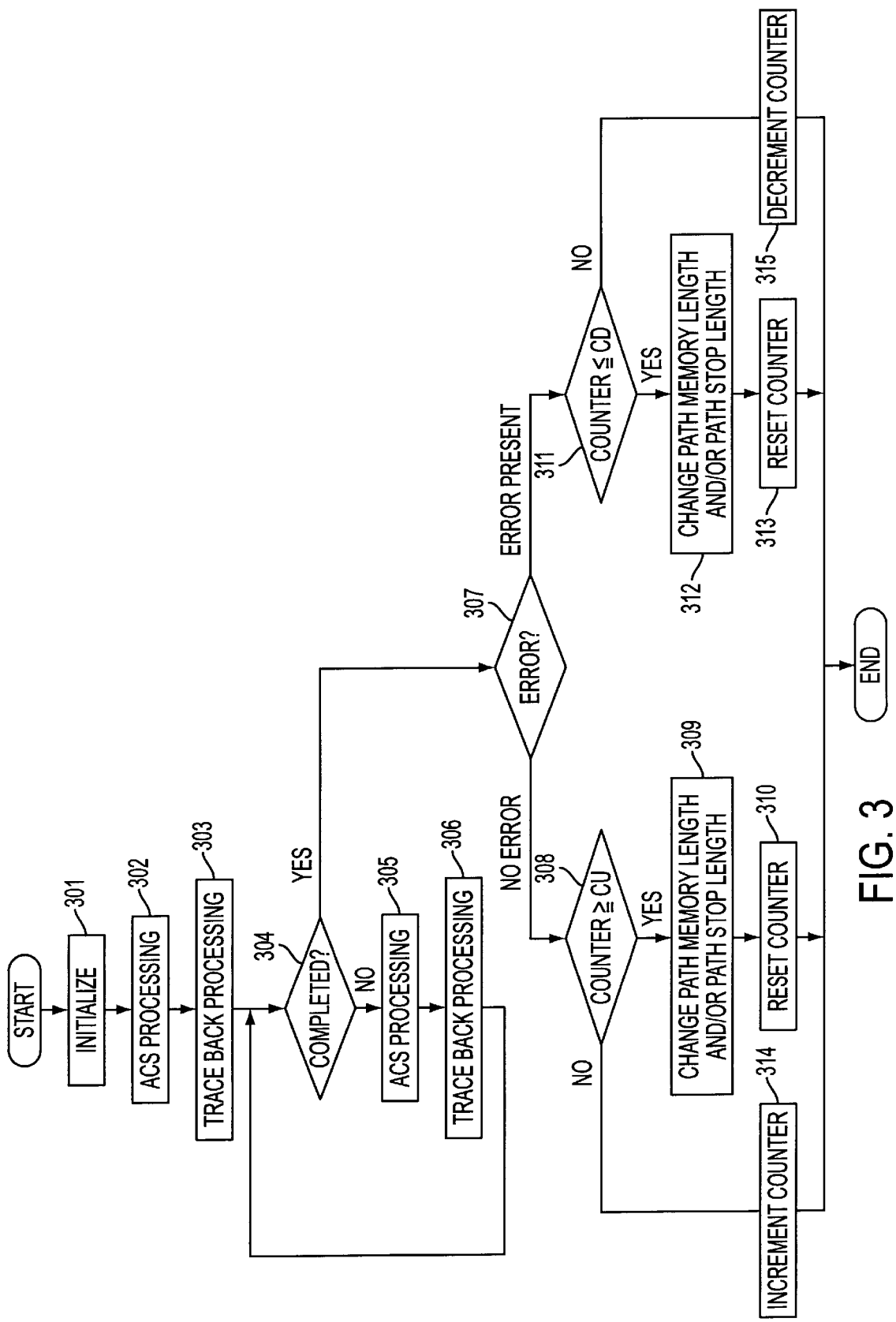
FIG. 3 is a flow chart explaining a trace back method according to a first preferred embodiment of the present invention.

FIG. 3 is a flow chart describing a trace back method according to a first preferred embodiment of the present invention. The trace back method according to a first preferred embodiment can update the path memory length and the path stop length which greatly influence FER, based on the result of the frame error decision. Also, the path memory length (At1) and the path stop length (At2) in a first preferred embodiment are the same as them used in describing the related technology. And there is the following relationship between the path memory length (At1) and the path stop length (At2) in a first preferred embodiment; $At1 \geq At2$.

Figure 4:
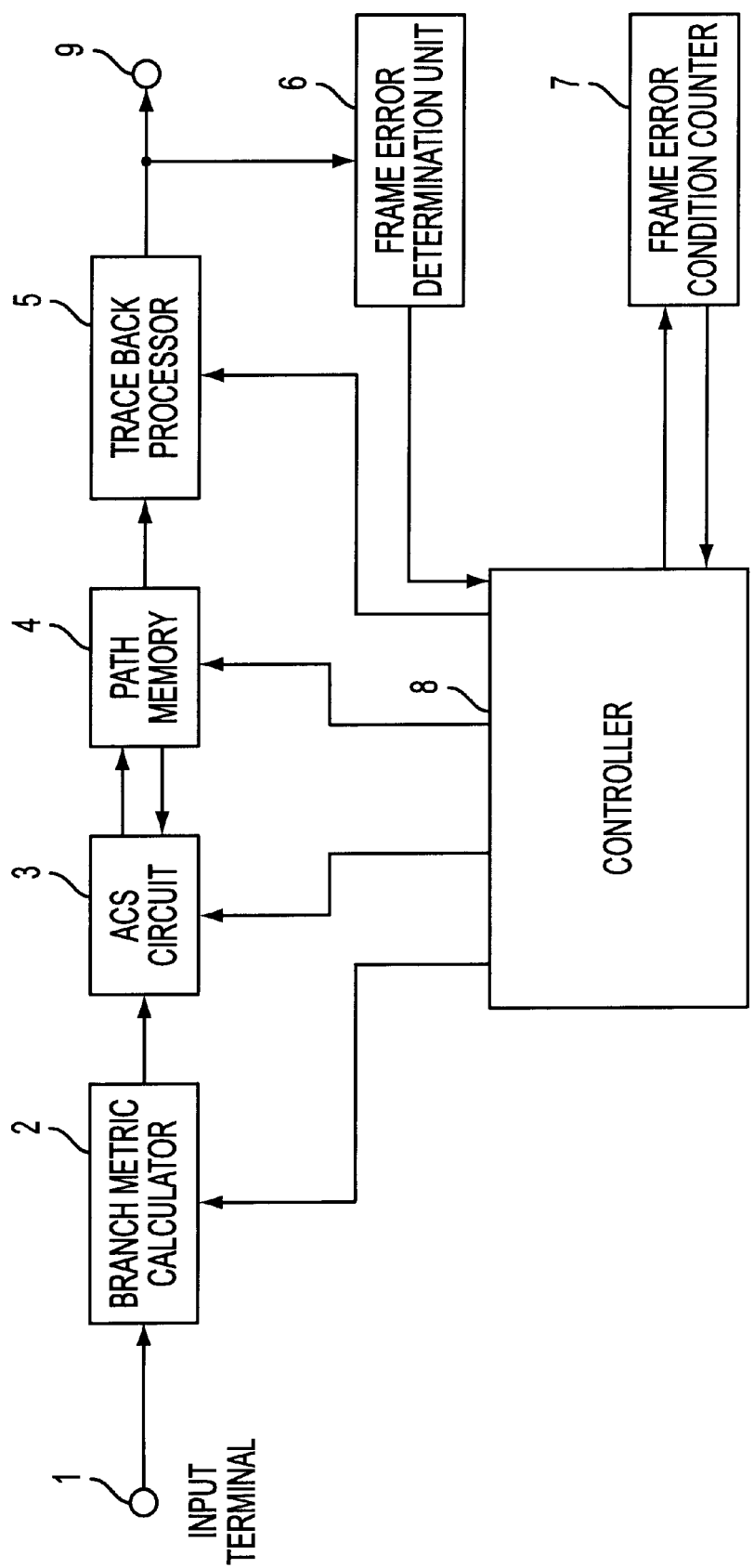
FIG. 4 is a Viterbi decoding device according to a first preferred embodiment of the present invention.

FIG. 4 is a Viterbi decoding device according to a first preferred embodiment of the present invention. The Viterbi decoding device is comprised of an input terminal 1, a branch metric calculator 2, an ACS circuit 3, a path memory 4, a trace back processor 5, a frame error determination part 6, a frame error condition counter 7, a controller 8 and an output terminal 9. This device are realized using DSP and dedicated hardware.

The controller 8 carries out initialization setting processing (step 301) at a time when decoding of the data received for a new frame begins. The path memory length At1 and path stop length At2 to be applied to the current frame are also set in this initialization setting processing. Here, the path memory length At1 and the path stop length At2 of initial values that are decided beforehand are set for the initial frame of a communication. The path memory length At1 and the path stop length At2 of initialization values decided beforehand or the path memory length At1 and the path stop length At2 updated by a step 309 or step 312 to be described later are set for the remaining frames. At this time, the path memory length At1 and the path stop length At2 set for the initial frame of the communication are, for example, values at the middle of the variable range for the path memory length At1 and the path stop length At2. Processing is also carried out in the initialization setting processing for the initial frame of the communication to set the value of the frame error condition counter 7 to an initial value CC. This initial value CC is a value in the middle of an upper limit threshold value Cu and a lower limit threshold value CD to be described later (this does not have to be a middle value, and can also be, for example, a value close to the side of the lower limit threshold value CD).

After the initialization setting processing, the controller 8 executes operations at the branch metric calculator 2, ACS circuit 3 and path memory 4, the ACS calculation processing of the same number of times as the path memory length At1 is executed and path select signals obtained at each circuit are stored in the path memory 4 (step 302).

The controller 8 then executes trace back that refers to the stored contents of the path memory 4 at the trace back processor 5 by the number of times of the path memory length At1 (step 303), and whether or not trace back for all decode bits is complete at the time where trace back for At1 times finishes is determined (step 304).

When trace back is not finished for all decode bits, the controller 8 repeats ACS processing of the same number of times as the path stop length At2 (step 305) and trace back of the same number of times as the path memory length At1 (step 306).

When it is confirmed that trace back is complete for all decode bits, the controller 8 takes in frame error presence information determined by the frame error determination part 6 and distinguishes these contents (step 307). The frame error is determined based on the result of calculating a Hamming distance between the received signal and re-encoded signal with which the decoded signal is rendered to the same encoding as that for the received signal.

When a frame error is not detected, the value of the frame error condition counter 7 and the upper limit threshold value Cu are compared (step 308). The frame error condition counter 7 counts a frame error condition in the past frame. When the value of the counter 7 has not reached the upper limit threshold value CU, it cannot be said that the FER characteristics are further improved and the path memory length At1 and/or the path stop length At2 are not changed. on the other hand, when the value of the counter 7 has reached the upper limit threshold value CU, the FER characteristic can be said to be improved and the path memory length At1 and/or the path stop length At2 can be changed (step 309) in such a direction as to reduce the processing load (in other words, in a direction that slightly lowers the FER characteristic).

Changes in the path memory length At1 and/or the path stop length At2 in a direction that alleviates the processing load in step 309 can be made using any one of the following (1) to (5).

(1) Decrease the path memory length At1 by a prescribed unit amount.

(2) Increase the path stop length At2 by a prescribed unit mount.

(3) Decrease the path memory length At1 by a prescribed unit amount and increase the path stop length At2 by a prescribed unit amount.

(4) If the path memory length At1 has not reached a minimum value, the path memory length At1 is decreased by a prescribed unit amount, if so, the path stop length At2 is increased by a prescribed unit amount. Thus, the processing load is alleviated by decreasing the path memory length At1 until the path memory length At1 becomes the minimum value, and the processing load is alleviated by increasing the path stop length At2 from the path memory length At1 becoming the minimum value.

(5) If the path stop length At2 has not reached a maximum value, the path stop length At2 is increased by a prescribed unit amount, if so, the path memory length At2 is decreased by a prescribed unit amount. Thus, the processing load is alleviated by increasing the path stop length At2 until the path stop length At2 becomes the maximum value, and the processing load is alleviated by decreasing the path memory length At1 from the path stop length At2 becoming the maximum value.

When there is a result that there is no coincidence in step 308, the controller 8 increases the value for the frame error condition counter 7 by a prescribed unit amount (for example, 1). Further, when processing due to step 309 is finished, the controller 8 returns the value of the frame error condition counter 7 back to the initial value CC (step 310) and processing for the current frame ends.

On the other hand, when it is determined in step 307 that a frame error has been detected, the value of the frame error condition counter 7 and the lower limit threshold value CD are compared (step 311).

When the value of the counter 7 has not reached the lower limit threshold value CD, the FER characteristics cannot be said to deteriorate further, and the path memory length At1 and/or the path stop length At2 are not changed.

On the other hand, when the value of the counter 7 has reached the lower limit threshold value CD, the FER characteristic can be said to deteriorate further. Thus, the path memory length At1 and/or the path stop length At2 are changed (step 312) in a direction that causes the FER characteristic to improve (in other words, in a direction that causes the processing load to become slightly heavier).

Changes in the path memory length At1 and/or the path stop length At2 in a direction that improves the FER characteristic in step 312 can be carried out using any one of the following methods (1) to (5).

(1) Increase the path memory length At1 by a prescribed unit amount.

(2) Decrease the path stop length At2 by a prescribed unit amount.

(3) Increase the path memory length At1 by a prescribed unit amount and decrease the path stop length At2 by a prescribed unit amount.

(4) If the path memory length At1 has not reached a maximum value, the path memory length At1 is increased by a prescribed unit amount, and if so, the path stop length At2 is decreased by a prescribed unit amount. Thus, the FER is improved by increases in the path memory length At1 until the path memory length At1 becomes the maximum value, and the FER is improved by decreasing the path stop length At2 from when the path memory length At1 becomes the maximum value.

(5) If the path stop length At2 has not reached a minimum value, the path stop length At2 is decreased by a prescribed unit amount, and if so, the path memory length At1 is increased by a prescribed unit amount. Thus, the FER is improved by decreasing the path stop length At2 until the path stop length At2 becomes the minimum value, and the FER is improved by increasing the path memory length At1 from the path stop length At2 becoming the minimum value.

When there is a result that there is no coincidence in step 311, the controller 8 decreases the value for the frame error condition counter 7 by a prescribed unit amount (for example, 1). Further, when changing processing due to step 312 is finished, the controller 8 returns the value of the frame error condition counter 7 back to the initial value CC (step 313) and processing for the current frame ends. The values of the path memory length At1 and/or the path stop length At2 changed in the processing steps 309 and 312 for the current frame, are used to stipulate the number of times for the ACS calculation processing and trace back processing for the following frame onwards.

Figure 5:
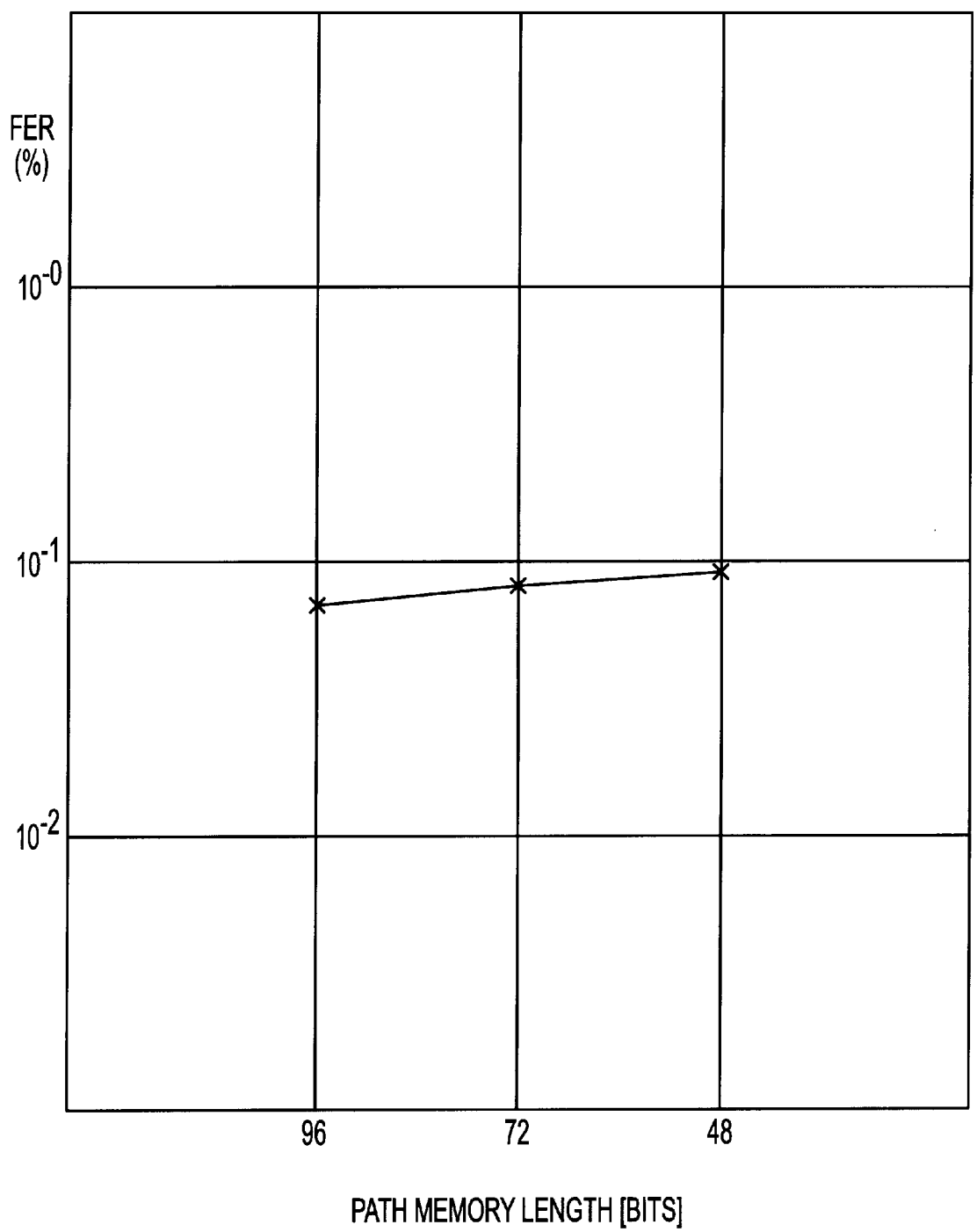
FIG. 5 is a graph showing the relationship between the path memory length and Frame Error Rate (thereinafter FER).
Figure 6:
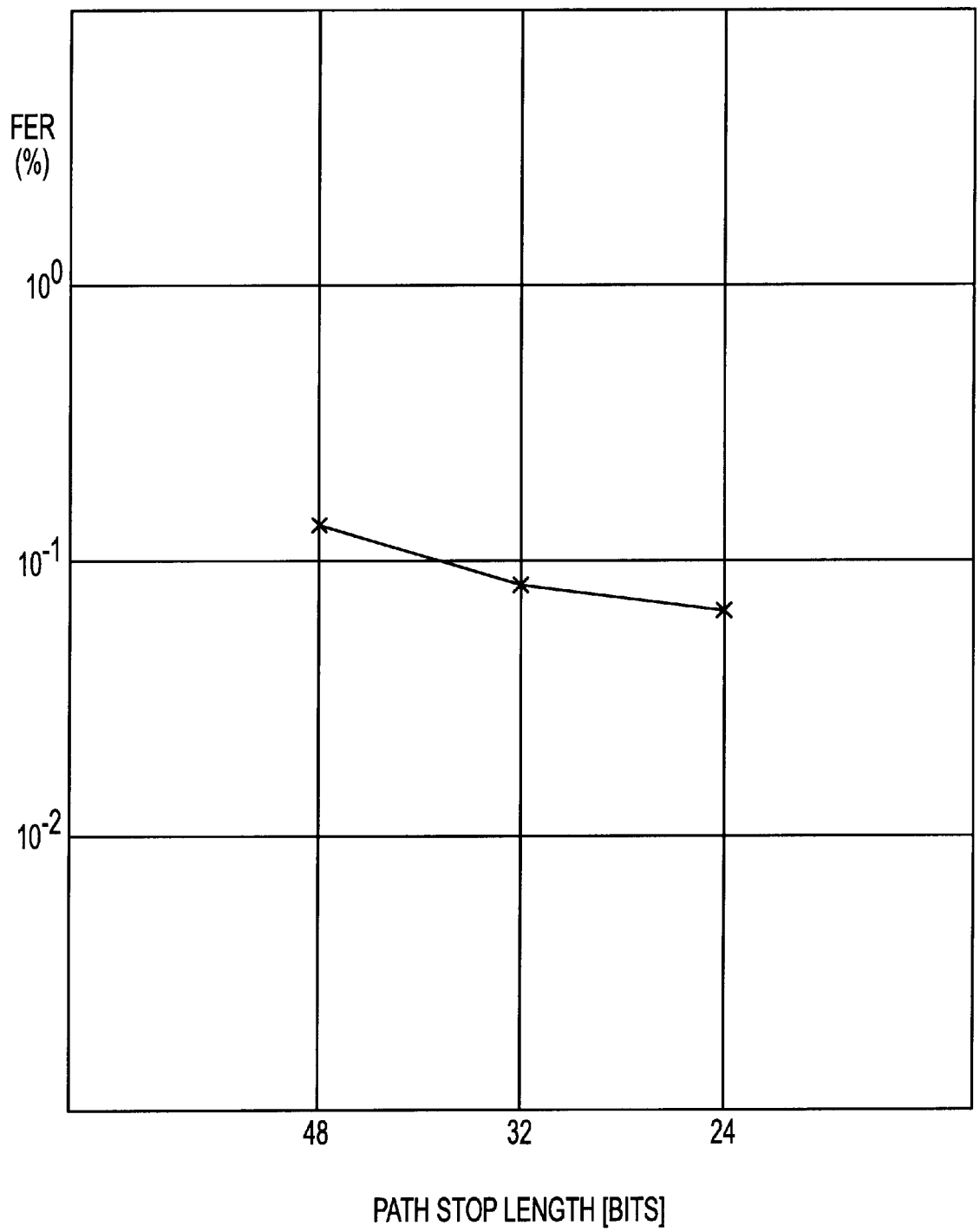
FIG. 6 is a graph showing the relationship between the path stop length and FER.

FIG. 5 is a graph showing the relationship between the path memory length and FER. FIG. 6 is a graph showing the relationship between the path stop length and FER. The examples in FIG. 5 and FIG. 6 show FER at the time of changes in the path memory length and the path stop length for North American CDMA method Traffic Rate-Rate set 2-Full rate signals (total decode bit number=288 bits).

FIG. 5 shows the FER characteristic when the path stop length is fixed at 24 bits and the path memory length is changed, and FIG. 9 shows the FER characteristic when the path memory length is fixed at 96 bits and the path stop length is changed. It can be understood from FIGS. 5 and 6 that the FER characteristic is better for large values of path memory length and for small values of path stop.

The FER characteristic is better for large values of path memory length, but the number of times the step 306 executed in the algorithm of FIG. 3 is increased. On the other hand, the FER characteristic is better for small values of path stop length but the number of times the step 305 in the algorithm of FIG. 3 executed in the algorithm of FIG. 3 is increased. Put another way, the FER characteristic deteriorates as the value for the path memory length is made shorter but the number of times the algorithm is executed is reduced Further, the FER characteristic deteriorates as the value for the path stop length is made larger but the number of times the algorithm is executed is reduced.

According to the first preferred embodiment, the presence or absence of frame errors is determined by the frame error determination part 6 and the path memory length At1 and/or the path stop length At2 are changed as appropriate based on the results of the above determinations. Therefore, the FER characteristics can be maintained in a desirable state and the processing load can be kept to the minimum value.

A second preferred embodiment

A trace back method in the Viterbi decoding algorism according to a second preferred embodiment of the present invention will hereinafter be described in detail with reference to FIG. 7.

Figure 7:
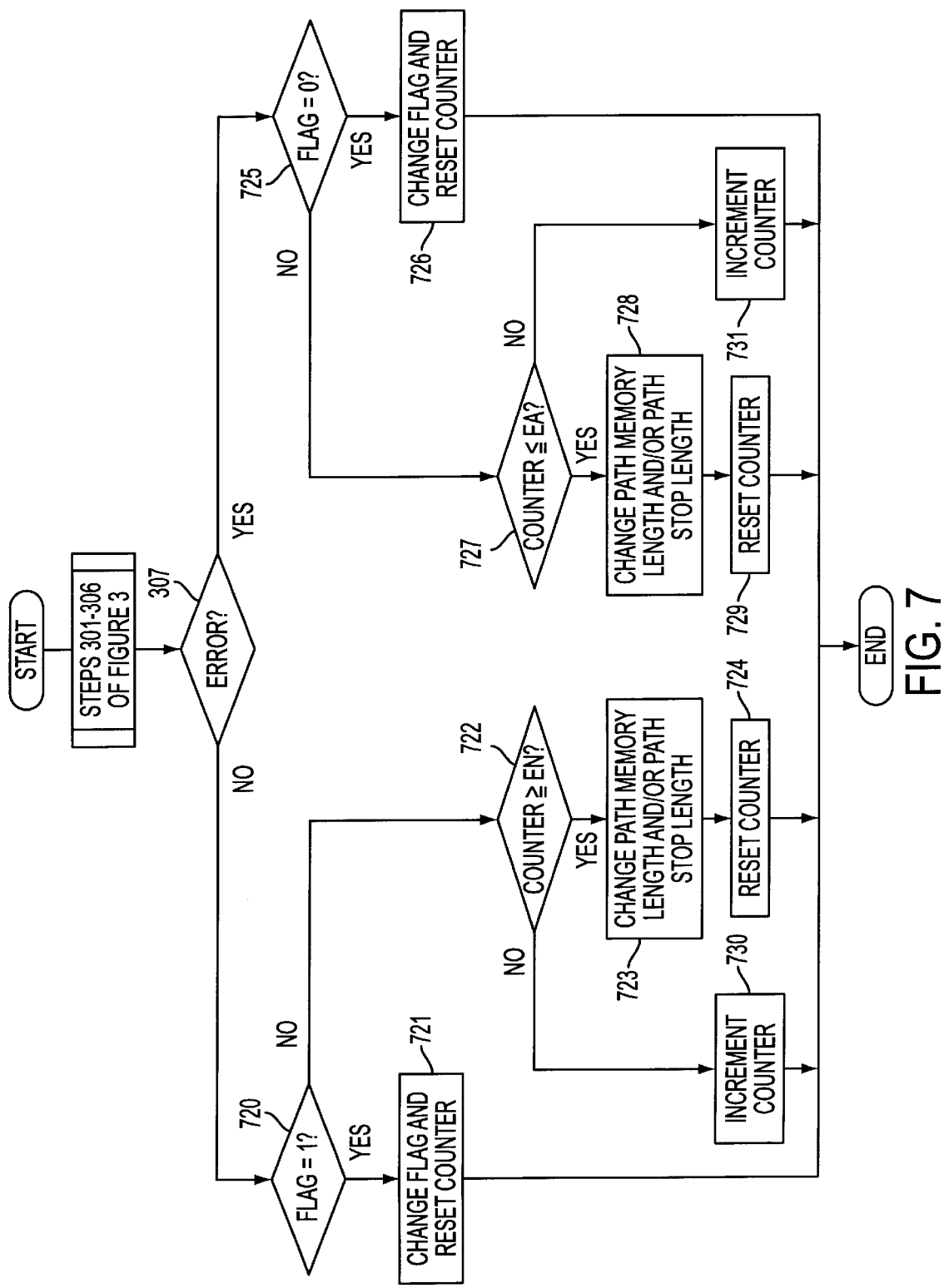
FIG. 7 is a flow chart explaining a trace back method according to a second preferred embodiment of the present invention.

FIG. 7 is a flow chart describing a trace back method according to a second preferred embodiment of the present invention. The Viterbi decoding method of the second embodiment is an algorithm that updates the values of the path memory length and the path stop length, that greatly influence FER, by using results of frame error determinations. And there is the following relationship between the path memory length At1 and the path stop length At2 in a second preferred embodiment; At1≧At2.

The difference of the Viterbi decoding method algorithm of the second embodiment with that of the first embodiment is that the path memory length and/or the path stop length are made to change when the number of consecutive frames for which there are frame errors reaches a prescribed number or when the number of consecutive frames for which there are no frame errors reaches a prescribed number.

The Viterbi decoding device according to a second preferred embodiment of the present invention can also be expressed using FIG. 4. However, the operation of the controller 8 is different from that of the first preferred embodiment, moreover, an up counter (or a down counter) is applied as the frame error condition counter 7 rather than an up/down counter.

In the algorithm of the Viterbi decoding method of the second embodiment, the frame decoding process up until the frame error information is taken in by the controller 8 (step 301 to step 307) is the same as for the first embodiment and as such, is not described in the second preferred embodiment.

However, processing described in the following is carried out in the initial setting step 301 to set the error flag to O and the initial value setting for the frame error condition counter 7 is set to O in step 301.

When a frame error is not detected in step 307, the controller 8 determines the value of the error flag which displays the presence or absence of errors in the previous frame, at this time (step 720).

The value of the error flag which is 1, shows that there is an error in the previous frame. At this time, the controller 8 changes the value of the error flag from 1 to 0 (no frame error), resets the frame error condition counter 7 to the initial value 0 and ends the frame processing for the current frame (step 721).

On the other hand, when the error flag value is O and there is no error in the previous frame in step 720, the value of the frame error condition counter 7 and a consecutive error absent threshold value EN are compared (step 722). When the value of the counter 7 has not reached the threshold value EN, the FER characteristic cannot be said to have improved further and the path memory length At1 and/or the path stop length At2 are not changed. However, when the value of counter 7 has reached the threshold value EN, the FER characteristic can be said to have been further improved and the path memory length At I and/or the path stop length At2 are changed (step 723), in a direction that alleviates the processing load (in other words, in a direction that slightly lowers the FER characteristic).

When the value of the counter 7 has not reached, the controller 8 increases the value of the frame error condition counter 7 by a prescribed unit amount (for example, 1) and the processing for the current frame is complete. When the processing for changing of step 723 is finished, the controller 8 returns the value of the frame error condition counter 7 to the initial value O (step 724) and the processing for the current frame is complete.

On the other hand, when a frame error is detected in step 307, the controller 8 determines the value of the error flag which shows the presence or absence of an error in the previous frame, at this time (step 725).

The value of the error flag which is 0, shows that there is no error in the previous frame. At this time, the controller 8 changes the value of the error flag from 0 to 1 (frame error present), resets the frame error condition counter 7 to the initial value 0 and ends the frame processing for the current frame (step 726).

On the other hand, when the error flag value is 1 and there is an error present in the previous frame in step 725, the value of the frame error condition counter 7 and a consecutive error present threshold value EA are compared (step 727).

When the value of the counter 7 has not reached the threshold value EA, the FER characteristic cannot be said to have deteriorated further and the path memory length At1 and/or the path stop length At2 are not changed.

However, when the value of the counter 7 has reached the threshold value EA, the FER characteristic can be said to have further deteriorated and the path memory length At1 and/or the path stop length At2 are changed (step 727) in a direction that improves the FER characteristic (in other words, in a direction that slightly increases the processing load).

When the value of the counter 7 has not reached, the controller 8 increases the value of the frame error condition counter 7 by a prescribed unit amount (for example, 1) and the processing for the current frame is complete. When the processing for changing of step 728 is finished, the controller 8 returns the value of the frame error condition counter 7 to the initial value O (step 729) and the processing for the current frame is complete.

The values of the path memory length At1 and/or the path stop length At2 changed in steps 723 and 728 for the current frame, are used to stipulate the number of times for the ACS calculation processing and trace back processing for the following frame onwards.

In the second preferred embodiment also, the presence or absence of frame errors is determined by the frame error determination part 6 and the path memory length At1 and/or the path stop length At2 are changed as appropriate in response to the results of these determinations. The FER characteristics can be maintained in a desirable state and the processing load can be kept to a minimum value.

Further preferred embodiments

In the above embodiments, various situations are shown where one of either the path memory length or the path stop length is changed. However, it is intended that the most appropriate design is adopted within designs for entire communications devices including decoding devices to which the present invention is applied. In the case of equipment used in environments where the FER characteristic is not changed substantially, it is sufficient to change just one of either the path memory length or the path stop length. However, in the case of equipment used in environments where the FER characteristic is changed substantially, there are also cases where changes in both the path memory length and the path stop length may be required.

In the above embodiments, cases are shown where the path memory length At1 and/or the path stop length At2 are changed so as to alleviate the processing load under the condition that the FER is improving (the condition of no frame errors) but it is also possible to not execute changes in this direction.

In the above embodiments only one frame error condition counter 7 is provided for counting frame errors but it is also possible to provide separate counters for updating the path memory length At I and the path stop length At2.

This is to say that the detailed updating method and updating configuration are by no means limited providing that the path memory length At1 and/or the path stop length At2 can be changed in response to the frame error conditions.

According to the present invention, a Viterbi decoding method and Viterbi decoding device capable of regulating the balance of the processing load and the FER characteristic can be realized by updating the path memory length At1 and/or the path stop length At2 in response to frame error conditions.

What is claimed is:

1. An improved Viterbi decoding method for decoding a received signal by doing an ACS process and a trace back process a first number of times, and doing the ACS process a second number of times and the trace back process the first number of times until the trace back process is complete for all bits to be decoded, wherein the improvement comprises:

after the trace back processing has finished for all of the bits to be decoded, deciding a frame error based on the result of calculating a Hamming distance between the received signal and a re-encoded decoded signal; and changing the first number or the second number based on the frame error and a value of a counter which signifies the condition of the frame error for the past several times.

2. A Viterbi decoding method as claimed in claim 1, wherein the step for changing the first number or the second number changes them when there is no frame error and when the value of the counter is more than an upper limit threshold value.

3. A Viterbi decoding method as claimed in claim 1, wherein the step for changing the first number or the second number does not change them when there is no frame error and when the value of the counter is less than the upper limit threshold value.

4. A Viterbi decoding method as claimed in claim 1, wherein the step for changing the first number or the second number changes them when there is a frame error and when the value of the counter is less than a lower limit threshold value.

5. A Viterbi decoding method as claimed in claim 1, wherein the step for changing the first number or the second number does not change them when there is a frame error and when the value of the counter is more than a lower limit threshold value.

6. A Viterbi decoding method as claimed in claim 1, wherein the step for changing the first number or the second number changes them further based on an error flag value which signifies the presence or absence of errors in the previous frame.

7. A Viterbi decoding method as claimed in claim 6, wherein the step for changing the first number or the second number, changes them when there is no frame error and when the value of the counter is more than an upper limit threshold value.

8. A Viterbi decoding method as claimed in claim 6, wherein the step for changing the first number or the second number, does not change them when there is no frame error and when the value of the counter is less than a upper limit threshold value.

9. A Viterbi decoding method as claimed in claim 6, wherein the step for changing the first number or the second number, changes them when there is a frame error and when the value of the counter is less than a lower limit threshold value.

10. A Viterbi decoding method as claimed in claim 6, wherein the step for changing the first number or the second number, does not change them when there is a frame error and when the value of the counter is more than a lower limit threshold value.

11. An improved Viterbi decoding method for decoding a received signal by doing an ACS process and a trace back process a first number of times, and doing the ACS process a second number of times and the trace back process the first number of times until the trace back process is complete for all bits to be decoded, wherein the improvement comprises:

a frame error determination unit for deciding a frame error based on the result of calculating a Hamming distance between the received signal and a re-encoded decoded signal;

a frame error condition counter for counting the frame error for the past frame; and a controller for deciding whether the first number or the second number changes or not based on the result of the frame error determination unit and the value of the frame error condition counter.

12. A Viterbi decoding method for decoding a received signal by doing an ACS process and a trace back process a first number of times, and doing the ACS process a second number of times and the trace back process the first number of times until the trace back process is complete for all bits to be decoded, wherein the improvement comprises:

after the trace back processing has finished for all of the bits to be decoded, deciding a frame error based on the result of calculating a Hamming distance between the received signal and a re-encoded decoded signal; and changing the first number and the second number based on the frame error and a value of a counter which signifies the condition of the frame error for the past several times.

13. A Viterbi decoding method as claimed in claim 12, wherein the step for changing the first number and the second number changes them further based on an error flag value which signifies the presence or absence of errors in the previous frame.

14. An improved Viterbi decoding method for decoding a received signal by doing an ACS process and a trace back process a first number of times, and doing the ACS process a second number of times and the trace back process the first number of times until the trace back process is complete for all bits to be decoded, wherein the improvement comprises:

a frame error determination unit for deciding a frame error based on the result of calculating a Hamming distance between the received signal and a re-encoded decoded signal;

a frame error condition counter for counting the frame error for the past frame; and a controller for deciding whether the first number and the second number changes or not based on the result of the frame error determination unit and the value of the frame error condition counter.

* * * * *